US012803442B2

(12) United States Patent
Marahrens et al.

(10) Patent No.: US 12,803,442 B2
(45) Date of Patent: Nov. 17, 2026

(54) ELECTRIC DEVICE INCLUDING A DRIVER CIRCUIT FOR SUPPLYING A CONTROL INPUT OF A CONTROLLED FIRST SEMICONDUCTOR SWITCH

(71) Applicant: SEW-EURODRIVE GMBH & CO. KG, Bruchsal (DE)

(72) Inventors: Klaus Marahrens, Waldbronn-Reichenbach (DE); Josefine Dukar, Karlsruhe (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 240 days.

(21) Appl. No.: 18/719,399

(22) PCT Filed: Nov. 28, 2022

(86) PCT No.: PCT/EP2022/083547
§ 371 (c)(1),
(2) Date: Jun. 13, 2024

(87) PCT Pub. No.: WO2023/110384
PCT Pub. Date: Jun. 22, 2023

(65) Prior Publication Data

US 2026/0171913 A1 Jun. 18, 2026

(30) Foreign Application Priority Data

Dec. 13, 2021 (DE) ......................... 102021006145.4

(51) Int. Cl.
*H02M 3/158* (2006.01)
*H02M 1/08* (2006.01)
(Continued)

(52) U.S. Cl.
CPC ............ *H02M 3/158* (2013.01); *H02M 1/08* (2013.01); *H02M 1/32* (2013.01); *H02M 3/156* (2013.01);
(Continued)

(58) Field of Classification Search
None
See application file for complete search history.

(56) References Cited

U.S. PATENT DOCUMENTS 4,443,719 A 4/1984 Planer
11,595,035 B1 * 2/2023 Li ........................ H03K 17/165
(Continued)

FOREIGN PATENT DOCUMENTS

CN 103986315 B 8/2016
DE 112012007247 T5 10/2015
(Continued)

OTHER PUBLICATIONS

EP 3896853 A1 translation (Year: 2021).*
(Continued)

*Primary Examiner* — Cassandra F Cox
(74) *Attorney, Agent, or Firm* — Carter, DeLuca & Farrell LLP

(57) ABSTRACT

An electric device includes a driver circuit for supplying a control input of a controlled first semiconductor switch, e.g., of a field-effect-controlled semiconductor switch. The switch-on current path leading from the driver circuit to the control input, e.g., of the driver circuit, has an inductance, and, for example, there is no inductance in the switch-off current path leading from the control input to the driver circuit.

26 Claims, 1 Drawing Sheet

(51) Int. Cl.

| | |
|---|---|
| ***H02M 1/32*** | (2007.01) |
| ***H02M 3/156*** | (2006.01) |
| ***H03K 17/082*** | (2006.01) |
| ***H03K 17/56*** | (2006.01) |
| ***H03K 17/567*** | (2006.01) |

(52) U.S. Cl.
CPC ...... *H02M 3/1582* (2013.01); *H03K 17/0822* (2013.01); *H03K 17/56* (2013.01); *H03K 17/567* (2013.01)

(56) References Cited

U.S. PATENT DOCUMENTS

| | | | | |
|---|---|---|---|---|
| 2011/0221480 | A1 | 9/2011 | Ikeda | |
| 2013/0009672 | A1 | 1/2013 | Olivo | |
| 2015/0318850 | A1 | 11/2015 | Hiyama | |
| 2021/0351178 | A1* | 11/2021 | Wood | H03K 17/567 |

FOREIGN PATENT DOCUMENTS

| | | | | |
|---|---|---|---|---|
| EP | 2980993 | A1 | 2/2016 | |
| EP | 3136599 | A1 | 3/2017 | |
| EP | 3896853 | A1 * | 10/2021 | H03K 17/164 |
| WO | 2021/074387 | A1 | 4/2021 | |

OTHER PUBLICATIONS

Albach, M., "Extended Equivalent Circuit Diagrams in Power Electronics" Erweiterte Ersatzschaltbilder in der Leistungselektronik (2017) pp. 307-309, vol. 1 Basics, with English language translation.

International Report on Patentability issued in corresponding International Application No. PCT/EP2022/083547, dated Jun. 13, 2024, pp. 1-8, English Translation.

International Search Report issued in corresponding International Application No. PCT/EP2022/083547 dated Mar. 20, 2023, pp. 1-2, English Translation.

* cited by examiner

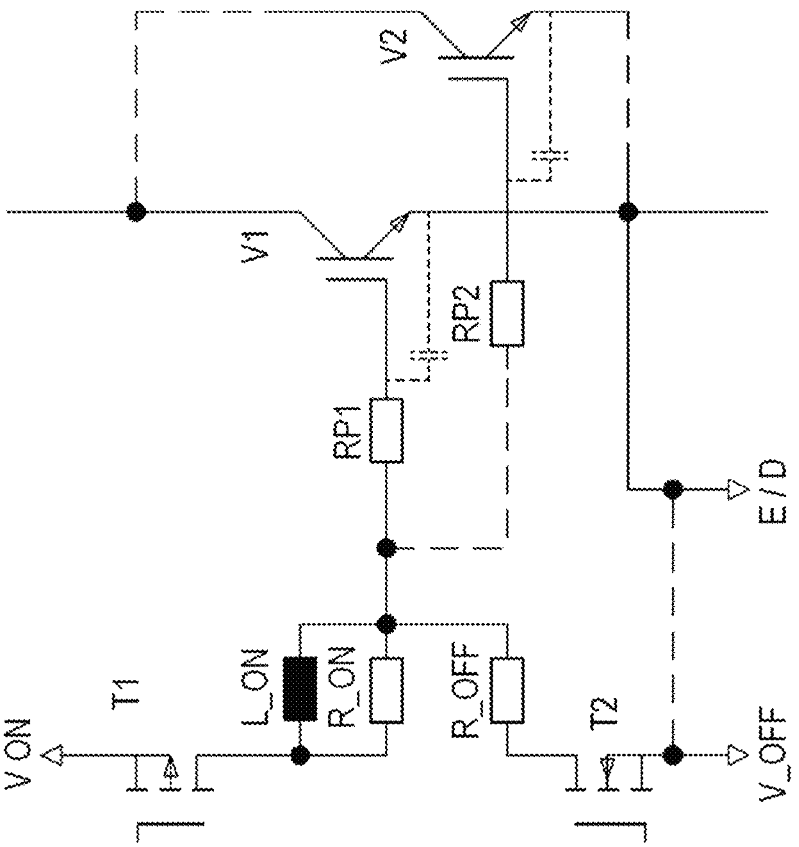
V2
V1
RP2
RP1
E / D
L_ON
R_ON
R_OFF
T1
T2
V ON
V_OFF

ELECTRIC DEVICE INCLUDING A DRIVER CIRCUIT FOR SUPPLYING A CONTROL INPUT OF A CONTROLLED FIRST SEMICONDUCTOR SWITCH

FIELD OF THE INVENTION

The present invention relates to an electric device including a driver circuit for supplying a control input of a controlled first semiconductor switch.

BACKGROUND INFORMATION

In certain conventional systems, the control input of a power semiconductor can be controlled by a driver circuit.

A driver circuit having two half bridges and being operated in a time-controlled manner for an IGBT is described in Chinese Patent Document No. 103986315.

A control circuit for a switching element is described in German Patent Document No. 11 2012 007 247.

An adjustable hybrid switch for power converters is described in PCT Patent Document No. WO 2021/074387.

SUMMARY

Example embodiments of the present invention reduce power losses in an electrical device.

According to example embodiments, an electrical device includes a driver circuit for supplying a control input of a controlled first semiconductor switch, e.g., of a field-effect-controlled semiconductor switch. For example, a load current, e.g., a load current of more than 10 amperes, can be switched and/or controlled by the first controlled semiconductor switch. The switch-on current path leading from the driver circuit to the control input, e.g., of the driver circuit, has an inductance. For example, there is no inductance in the switch-off current path leading from the control input to the driver circuit.

An advantage of this arrangement is that at switch-on, e.g., during the collector-emitter or drain-source voltage change at the first controlled semiconductor switch, of the power semiconductor, i.e., of the first controlled semiconductor switch, the charging current is constant due to the inductance, and, thus, the intrinsic capacitance at the control input of the semiconductor switch can only be charged with a constant current. In this manner, the duration of the Miller plateau is independent of the load current, i.e., substantially independent of the load current to be switched by the first semiconductor switch. As a result, the current and voltage curves are provided such that less power dissipation is generated at switch-on.

The switching behavior is, thus, controlled by an oscillating circuit in a physically given and thus safe manner in contrast to the time-controlled, e.g., computer-controlled, switching behavior of conventional systems.

The switch-off current path does not have an inductance arranged as a component. A low inductance value of the electrical lines exists for physical reasons, but is orders of magnitude smaller than the inductance value of the entire switch-on current path, since this has the inductance arranged as a component. For example, inductance is understood to mean the inductance arranged as a component.

According to example embodiments, the inductance is dimensioned such that the rate of voltage change dU/dt in the region of the Miller plateau, e.g., of the controlled first semiconductor switch, is independent of the load current, e.g., of the load current to be controlled by the controlled first semiconductor switch. Thus, the inductance limits the rate of voltage change or, respectively, stabilizes it over the load current range and thus such voltage curves and current curves are caused that the power dissipation is reduced.

According to example embodiments, a resistor R_ON, e.g., an ohmic resistor, is connected in parallel with the inductance, e.g., the resistor R_ON is arranged as a component. Thus, no purely inductive behavior is caused in the switch-on current path and, thus, oscillation tendency is prevented.

According to example embodiments, the driver circuit has a half bridge, which has a first switch in its upper branch, e.g., and the inductance, and a second switch in its lower branch. For example, the upper branch has a series circuit formed by the first switch and a first resistor. For example, the lower branch has a series circuit formed by the first switch and a second resistor. Thus, the driver circuit is inexpensive to produce, e.g., since the inductor can be arranged as a low-cost component.

According to example embodiments, a terminal, e.g., the emitter or source, of the first switch is connected with a terminal, e.g., the collector or drain, of the second switch via the first resistor R_ON and the second resistor R_OFF connected in series with the first resistor R_ON. For example, the inductance L_ON is connected in parallel with the first resistor R_ON. Thus, the two switches are not directly electrically connected with each other.

According to example embodiments, a second controlled semiconductor switch, e.g., a field-effect-controlled semiconductor switch, is connected with the first controlled semiconductor switch. Thus, large currents can be switched, as the load current is divided among the semiconductor switches.

According to example embodiments, the switch-off current path leading from the control input to the driver circuit has an ohmic resistance, e.g., no inductance. Thus, no current limitation is arranged in the switch-off path, and a fast switch-off is possible.

According to example embodiments, a second controlled semiconductor switch is connected in parallel with the first controlled semiconductor switch, and the first controlled semiconductor switch is controlled synchronously with the second controlled semiconductor switch. Thus, larger currents can be switched.

According to example embodiments, the driver circuit is supplied from a DC voltage whose upper potential is connected with the drain terminal or collector terminal of the first switch, and the lower potential is connected with the source terminal or emitter terminal of the second switch. For example, the first switch is a field effect transistor and/or the second switch is a field effect transistor. Thus, ready production is possible.

According to example embodiments, an additional capacitance is provided from the control input of the first controlled semiconductor switch to its source or emitter, and/or an additional capacitance is provided from the control input of the second controlled semiconductor switch to its source or emitter. Thus, the current change over time can be dimensioned, and a desired switching behavior can also be achieved in interaction with the inductance. Time control is not necessary at switch-on, but the switch-on takes place in a physically given manner.

Further features and aspects of example embodiments of the present invention are explained in more detail below with reference to the appended schematic Figures.

BRIEF DESCRIPTION OF THE DRAWINGS

FIG. 1 is a schematic circuit diagram illustrating an electronic circuit of a first electrical device.

DETAILED DESCRIPTION

As illustrated in FIG. 1, a controlled semiconductor switch V1, which is a field-effect controlled semiconductor switch, e.g., an IGBT or a MOSFET, is controlled by a driver circuit.

The driver circuit has a half-bridge including two switches (T1, T2), e.g., transistors or field-effect transistors, and the first switch T1 is connected in series with a parallel circuit including a resistor R_ON and an inductance L_ON, e.g., arranged as a component. The second switch T2 is connected in series with a resistor R_OFF. The center tap is arranged between the parallel circuit and the resistor R_OFF and feeds the control input of the first controlled semiconductor switch V1 via a resistor RP1. For example, the resistor RP1 can be arranged as an internal gate resistor, so that a real component can actually be omitted.

For switch-on, the first switch T1 becomes conductive and thus connects an upper potential of a DC voltage via the parallel circuit and the resistor RP1 to the control input of the first controlled semiconductor switch. Thus, the switch-on path has the parallel circuit and the resistor RP1. The second switch T2 remains locked.

For switch-off, the first switch T1 is opened and the second switch T2 becomes conductive, so that the control input of the first controlled semiconductor switch V1 is connected with the lower potential of the DC voltage via the resistor RP1 and the resistor R_OFF.

Thus, the driver circuit in the switch-on path has the first switch T1, whose conducted current, e.g., output current, is conducted in the conductive state of the first switch T1 via a parallel circuit of the inductance L_ON and an ohmic resistor R_ON and is then fed to the control input of the controlled semiconductor switch V1 via the further resistor RP1.

The dashed line in FIG. 1 indicates an additional controlled switch V2 provided in parallel with the first controlled switch V1, so that higher power levels can be switched.

No inductance is provided in the switch-off path, but only the series circuit of the ohmic resistors RP1 and R_OFF, as the current source-like control described herein is only provided at switch-on.

The controlled semiconductor switch V1 has a gate-drain capacitance or, respectively, a base-collector capacitance, which is referred to as the Miller capacitance.

At switch-on, the control current first charges the gate-source capacitance or, respectively, the base-emitter capacitance until a limit voltage, e.g., a threshold voltage, is reached, at which point the load current begins to flow. The load current flows from the drain to the source terminal or, respectively, from the collector to the emitter terminal of the controlled semiconductor switch V1. During this time range of the switch-on phase, the drain-source voltage or, respectively, the collector-emitter voltage is reduced. When the controlled semiconductor switch V1 fully conducts the load current, the drain-source voltage or, respectively, the collector-emitter voltage is reduced by the further switch-on.

It is important to note that as soon as the threshold voltage is exceeded, e.g., as soon as the controlled semiconductor switch V1 fully carries the load current, the Miller capacitance is loaded. For different load currents, if there were no inductance in the switch-on path, the rate of voltage change dU/dt would be different because different voltages are present at different load currents, e.g., because, as a result of the load current-dependent magnitude of the gate voltage during the Miller plateau, the drive current flowing into the gate is thus load current-dependent.

The inductance L_ON is arranged in the switch-on path, and the current source-like behavior of which inductance L_ON keeps the control current substantially constant. The Miller capacitance of the first controlled semiconductor switch V1 is thus only loaded with a substantially constant current, so that the rate of voltage change dU/dt is also constant, i.e., independent of the magnitude of the load current.

The rate of voltage change dU/dt is thus independent of the load current, despite the fact that the voltage level of the Miller plateau actually depends on the load current.

The inductance L_ON is dimensioned such that the rate of voltage change dU/dt is independent of the load current, namely over as large a region of the load current as possible, e.g., not just about the rated current, but, e.g., in the region of 20% to 100% of the rated current.

For example, as illustrated in dashed lines in FIG. 1, an additional capacitance is provided from the control input of the respective first controlled semiconductor switch to its source or emitter. This allows setting the current change over time.

For example, instead of loading the Miller capacitance, the Miller capacitance is reloaded.

For example, a plurality of controlled switches V2 additionally provided in parallel with the first controlled switch V1 are provided in accordance with the dashed line illustrated in FIG. 1, so that higher power levels can be switched.

LIST OF REFERENCE NUMERALS

T1 First switch
T1 Second switch
V1 First controlled semiconductor switch
V2 Second controlled semiconductor switch
L_ON Inductance
R_ON Ohmic resistance in the switch-on current path
R_OFF Ohmic resistance in the switch-off current path
RP1 Resistor, e.g., series resistor
RP2 Resistor, e.g., series resistor

The invention claimed is:

1. An electric device, comprising:
a driver circuit adapted to supply a control input of a controlled first semiconductor switch;
wherein switch-on current path leading from the driver circuit to the control input includes an inductance; and
wherein the control input is arranged as a control input of the driver circuit.

2. The electric device according to claim 1, wherein the first controlled semiconductor switch is arranged as a field-effect-controlled semiconductor switch.

3. The electric device according to claim 1, wherein the first controlled semiconductor switch is adapted to switch and/or control a load current.

4. The electric device according to claim 3, wherein the load current is greater than 10 amperes.

5. The electric device according to claim 1, wherein the inductance is arranged as an inductance and/or coil component.

6. The electric device according to claim 1, wherein there is no inductance in a switch-off current path leading from the control input to the driver circuit.

7. The electric device according to claim 1, wherein the inductance is dimensioned such that a rate of voltage change in a region of a Miller plateau of the controlled first semiconductor switch is independent of load current and/or of load current that is controllable by the controlled first semiconductor switch.

8. The electric device according to claim 1, wherein the inductance is dimensioned such that a rate of voltage change, a rate of change of a collector-emitter voltage with the first semiconductor switch being arranged as an IGBT, and/or a rate of change of a drain-source with the first semiconductor switch being arranged as a field-effect transistor in a region of the Miller plateau of the controlled first semiconductor switch is independent of a load current controllable by the controlled first semiconductor switch.

9. The electric device according to claim 1, wherein the driver circuit includes a half bridge having a first switch in an upper branch and a second switch in a lower branch.

10. The electric device according to claim 9, wherein the upper branch has a series circuit including the first switch and a first resistor, the inductance being connected in parallel with a first resistor, the lower branch has a series circuit including the second switch and a second resistor, the first resistor, the second resistor, and the inductance being arranged as separate components.

11. The electric device according to claim 10, wherein a terminal of the first switch is connected with a terminal of the second switch via the first resistor, and the second resistor is connected in series with the first resistor.

12. The electric device according to claim 11, wherein the inductance is connected in parallel with the first resistor.

13. The electric device according to claim 9, wherein the driver circuit includes exactly two switches, the two switches consisting of the first switch and the second switch.

14. The electric device according to claim 9, wherein the driver circuit has a single upper branch in which the first switch is arranged as the only switch in the upper branch, and the driver circuit has a single lower branch in which the second switch is arranged as the only switch in the lower branch.

15. The electric device according to claim 9, wherein the driver circuit is adapted to be supplied from a DC voltage having upper potential connected with a drain terminal or a collector terminal of the first switch and a lower potential connected with a source terminal or an emitter terminal of the second switch.

16. The electric device according to claim 15, wherein the first switch and/or the second switch is arranged is a field effect transistor.

17. The electric device according to claim 1, wherein the driver circuit includes fewer than four switches.

18. The electric device according to claim 1, wherein a second controlled semiconductor switch is connected with the first controlled semiconductor switch.

19. The electric device according to claim 18, wherein each of the two controlled semiconductor switches controls and/or switches a portion of a load current.

20. The electric device according to claim 18, wherein the second controlled semiconductor switch is arranged as a field-effect-controlled semiconductor switch and is connected in parallel with the first controlled semiconductor switch.

21. The electric device according to claim 1, wherein a switch-off current path leading from the control input to the driver circuit has an ohmic resistance and no inductance.

22. The electric device according to claim 1, wherein a second controlled semiconductor switch is connected in parallel with the first controlled semiconductor switch, and the first controlled semiconductor switch is controlled synchronously with the second controlled semiconductor switch.

23. The electric device according to claim 1, wherein a capacitance is provided from a control input of the first controlled semiconductor switch to a source of the first controlled semiconductor switch and/or a capacitance is provided from a control input of a second controlled semiconductor switch to a source of the second controlled semiconductor switch.

24. An electric device, comprising:

a driver circuit adapted to supply a control input of a controlled first semiconductor switch;

wherein switch-on current path leading from the driver circuit to the control input includes an inductance; and wherein an inductance value of an entire switch-on current path leading from the driver circuit to the control input is greater and/or at least one hundred times greater than an inductance value of an entire switch-off current path leading from the control input to the driver circuit.

25. The electric device according to claim 24, wherein the control input is arranged as a control input of the driver circuit.

26. An electric device, comprising:

a driver circuit adapted to supply a control input of a controlled first semiconductor switch;

wherein switch-on current path leading from the driver circuit to the control input includes an inductance; and wherein a resistor, an ohmic resistor, and/or a resistor arranged as a component is connected in parallel with the inductance.

* * * * *